United States Patent
Bachl et al.

(10) Patent No.: US 6,299,337 B1
(45) Date of Patent: Oct. 9, 2001

(54) FLEXIBLE MULTIPLE LED MODULE, IN PARTICULAR FOR A LUMINAIRE HOUSING OF A MOTOR VEHICLE

(75) Inventors: Bernhard Bachl; Günter Waitl, both of Regensburg (DE)

(73) Assignee: Osram Opto Semiconductors GmbH & Co. oHG, Regensburg (DE)

( * ) Notice: Subject to any disclaimer, the term of this patent is extended or adjusted under 35 U.S.C. 154(b) by 0 days.

(21) Appl. No.: 09/519,540

(22) Filed: Mar. 6, 2000

(30) Foreign Application Priority Data

Mar. 4, 1999 (DE) .............................. 199 09 399

(51) Int. Cl.⁷ .................. F21S 8/10; F21V 21/00
(52) U.S. Cl. ............................ 362/545; 362/250
(58) Field of Search .................... 362/543, 544, 362/545, 800, 555, 250, 252; 361/739, 749

(56) References Cited

U.S. PATENT DOCUMENTS

| | | | |
|---|---|---|---|
| 4,173,035 | * 10/1979 | Hoyt | 362/249 |
| 5,038,255 | * 8/1991 | Nishihashi et al. | 362/61 |
| 5,162,696 | * 11/1992 | Goodrich | 313/511 |
| 5,375,044 | * 12/1994 | Guritz | 362/104 |
| 5,404,282 | 4/1995 | Klinke et al. | 362/249 |
| 5,477,436 | * 12/1995 | Bertling et al. | 362/231 |
| 5,519,596 | 5/1996 | Woolverton | 362/250 |
| 5,673,995 | * 10/1997 | Segaud | 362/83.3 |
| 5,746,497 | * 5/1998 | Machida | 362/80 |
| 5,975,715 | * 11/1999 | Bauder | 362/226 |
| 6,045,240 | * 4/2000 | Hochstein | 362/294 |

OTHER PUBLICATIONS

"Flexibel verdrahten auf kleinstem Raum", Kober, Carl Hanser Verlag, München, 1996, pp. 356–359.
"Siemens SMT–Topled für die Oberflächenmontage", Frank Möller et al., Siemens Components 29, 1991, vol. 4, pp. 147–149.

* cited by examiner

Primary Examiner—Sandra O'Shea
Assistant Examiner—Jacob Choi
(74) Attorney, Agent, or Firm—Herbert L. Lerner; Laurence A. Greenberg; Werner H. Stemer

(57) ABSTRACT

The invention describes a flexible multiple LED module having a plurality of rigid printed circuit boards, which are each connected at one of their main surfaces to a flexible printed circuit board with a spacing between one another, and a plurality of LEDs, which are mounted in the region of the rigid printed circuit boards on the flexible printed circuit board. The multiple LED module is suitable particularly for installation in luminaire housings, in particular for motor vehicles.

8 Claims, 2 Drawing Sheets

FLEXIBLE MULTIPLE LED MODULE, IN PARTICULAR FOR A LUMINAIRE HOUSING OF A MOTOR VEHICLE

BACKGROUND OF THE INVENTION

FIELD OF THE INVENTION

The invention relates to a flexible multiple LED module which can be installed, in particular, in a luminaire housing, as can be used for example in exterior luminaires of motor vehicles.

Light-emitting diodes (LEDs) are increasingly being used in exterior and interior motor vehicle lighting systems, in particular for rear lights or brake lights, instead of the conventional incandescent lamps. LEDs have a longer service life as compared to incandescent lamps, better efficiency in the conversion of electrical energy into radiant energy in the visible spectral range, and, associated therewith, less emission of heat and overall a smaller space requirement. In construction, however, extra expenditure is necessary in the first instance, because, on account of the low luminance of a single LED compared with an incandescent lamp, it is necessary to construct a plurality of LEDs formed into an array.

A number of proposals have been disclosed heretofore for the realization of an LED array. For example, U.S. Pat. No. 5,404,282 describes an LED module in which a number of LEDs are fixedly mounted between two parallel, electrically conductive bars. That configuration is relatively efficient from a circuitry point of view, but is otherwise relatively inflexible for installation in a luminaire housing, i.e., a light assembly housing, since it cannot be adapted in a simple manner to curved housing forms (see FIG. 1 of U.S. Pat. No. 5,404,282).

U.S. Pat. No. 5,519,596 describes an LED module constructed from a metallic frame having rigid sections. LEDs are contact-connected between electrically conductive webs, and flexible sections, which are inserted between the rigid sections and are each constructed from a metallic, comb-like and bendable structure. Although that configuration yields the desired flexibility, by the same token it entails disadvantages. On the one hand, owing to the fact that the entire frame is produced from metal, the production of the flexible sections is excessively elaborate and difficult and, on the other hand, the circuit design in each case allows only the arrangement of one row of LEDs in a module section.

SUMMARY OF THE INVENTION

The object of the invention is to provide a flexible multiple LED module, in particular for a luminaire housing of a motor vehicle, which overcomes the above-noted deficiencies and disadvantages of the prior art devices and methods of this kind, and which, on the one hand, can be produced as simply as possible and, on the other hand, allows a large number of LEDs to be arranged in the individual module sections.

With the above and other objects in view there is provided, in accordance with the invention, a flexible multiple LED module, comprising:

a flexible printed circuit board;
a plurality of rigid printed circuit boards having main surfaces connected to the flexible printed circuit board and with a spacing distance between one another; and
a plurality of LEDs mounted on the flexible circuit board in a region of the rigid printed circuit boards.

In other words, the flexible multiple LED module has a plurality of rigid printed circuit boards which are composed of aluminum, for example, and are each connected at one of their main surfaces to a flexible printed circuit board with a given spacing between them. The LEDs are mounted in the region of the rigid printed circuit boards on the flexible printed circuit board. The flexible circuit board is thus preferably sandwiched between the individual rigid boards and the LEDs.

In accordance with an added feature of- the invention, the flexible printed circuit board carries an electric circuit and the LEDs are integrated in the electric circuit applied on the flexible printed circuit board. The LEDs are preferably produced using surface-mount technology SMT and mounted directly on the flexible printed circuit board in the region in which the flexible printed circuit board is bonded on the rigid printed circuit boards. This has the advantage of providing for optimum heat dissipation from the LEDs.

An LED that is preferably used is described by Möllmer and Waitl in the article "SIEMENS SMT-TOPLED für die Oberflächenmontage" [SIEMENS SMT-TOPLED for Surface Mounting], printed in the periodical *Siemens Components* 29 (1991), issue 4, p. 147 et seq. in connection with FIG. 1.

That form of LED is extremely compact and allows the arrangement of a multiplicity of LEDs on the flexible printed circuit board.

In accordance with an additional feature of the invention, the electric circuit comprises resistors disposed on the flexible printed circuit board in a region of the spacing distance between the rigid printed circuit boards.

In accordance with a preferred embodiment, the rigid circuit boards are formed of aluminum.

In accordance with another feature of the invention, the flexible printed circuit board is composed of flexible plastic. The preferred plastics are polyester or polyimide, so that the flexible circuit board would be a polyester or polyimide film. In a preferred embodiment, the flexible printed circuit board is constructed from a plurality of layers of polyimide (flexboard). The use of so-called flexboards, which are known per se in the prior art, is particularly preferred. Such flexboards are described, for example, by H. Kober in the article "Flexibel verdrahten auf kleinstem Raum" [Flexible wiring in a most confined space] in the periodical *F & X*, issue May 1996 p. 356 et seq., where these flexboards are described as multilayer printed circuit boards constructed homogeneously from a plurality of polyimide support films.

It is furthermore preferred for resistors that are contained in the electric circuit to be applied in the region of the spacings between the rigid printed circuit boards on the flexible sections of the flexible printed circuit board. As a result, the resistors can be thermally decoupled to an extent.

The multiple LED module according to the invention is particularly suitable for installation in a luminaire housing for ambient lighting, in particular for a motor vehicle, for example for rear or brake lights. There is therefore provided, in accordance with the invention, a multiple LED module assembly, comprising:

a luminaire housing for a motor vehicle; and
a flexible multiple LED module mounted in the housing, the flexible multiple LED module including
a flexible printed circuit board;
a plurality of rigid printed circuit boards having main surfaces connected to the flexible printed circuit board and with a spacing distance between one another; and
a plurality of LEDs mounted on the flexible circuit board in a region of the rigid printed circuit boards.

Other features which are considered as characteristic for the invention are set forth in the appended claims.

Although the invention is illustrated and described herein as embodied in a flexible multiple LED module, in particular for a luminaire housing of a motor vehicle, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
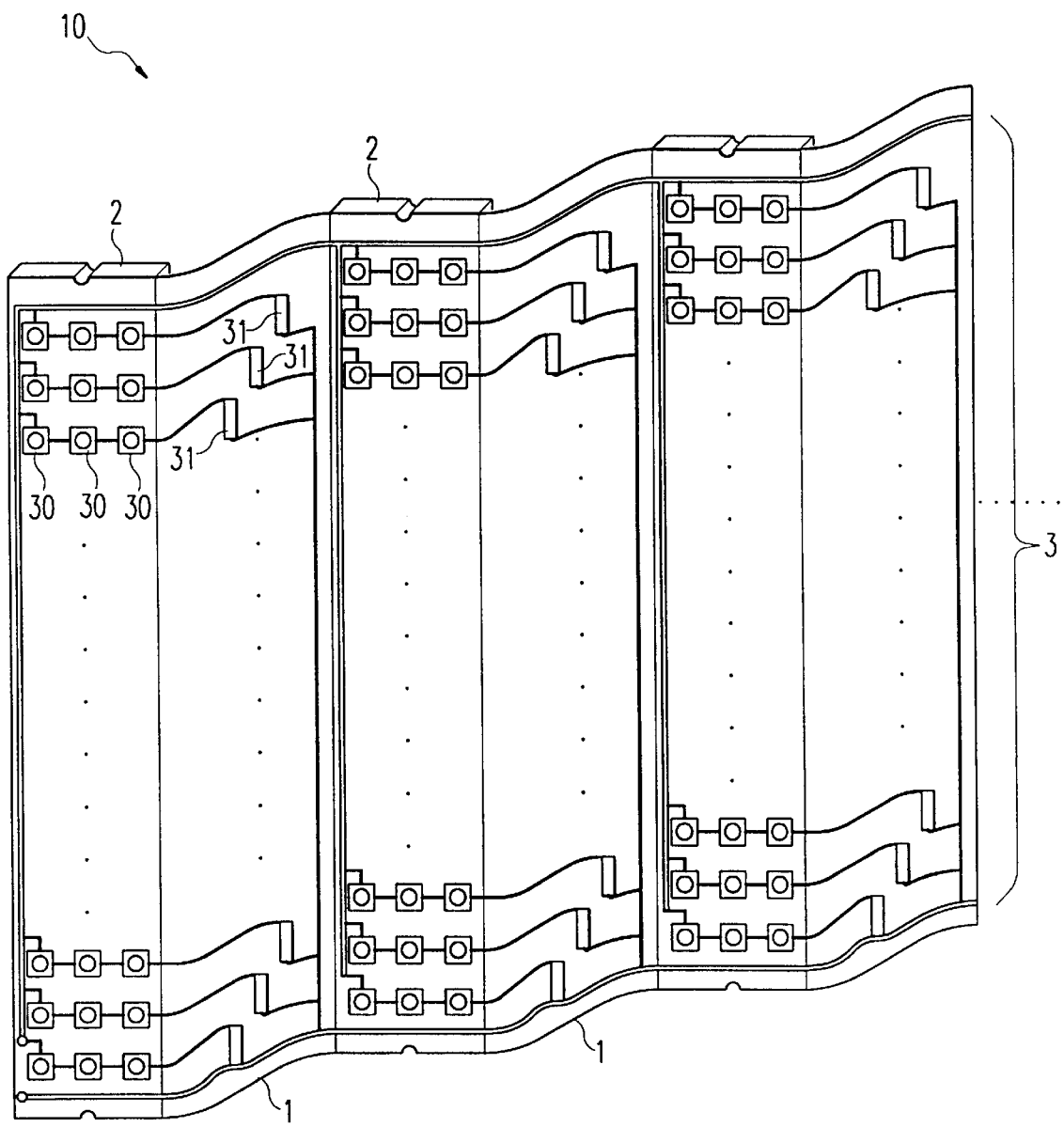
FIG. 1 is a slightly perspective view of a basic form of a multiple LED module according to the invention.

Referring now to the figures of the drawing in detail and first, particularly, to FIG. 1 thereof, there is seen a basic form of a multiple LED module with a number of bar-type, rigid printed circuit boards 2 which, in principle, can be produced from any rigid solid material. They are preferably composed of a metal, since good heat dissipation is desirable. Aluminum is particularly appropriate here since it is, moreover, also readily processable and malleable and has a low relative density, which is of importance with regard to the use in a motor vehicle. These rigid printed circuit boards 2 are arranged at a distance from one another, as illustrated, and a flexible printed circuit board 1, preferably a flexboard, is bonded onto the rigid printed circuit boards 2. The technology of bonding flexboards onto metal surfaces is well known to those of skill in the pertinent art and will, therefore, not be described in any detail here.

An electric circuit 3, containing LEDs 30 and, if appropriate, resistors 31, is then applied to the flexible printed circuit board 2 by soldering, preferably using known SMT technology. In this case, the LEDs 30 are mounted in the regions of the rigid printed circuit boards 2 and the resistors 31 are mounted in the regions of the flexible sections of the flexboard which lie between the rigid printed circuit boards 1. The LEDs are preferably formed in accordance with the above-mentioned SMT-TOPLED®.

In the course of production, the rigid printed circuit boards 2 are milled from a substrate in such a way that they are initially still connected to one another by narrow webs. Only after the flexible printed circuit board has been bonded on and the electric circuit 3 has been soldered on are the webs removed underneath the flexible sections of the flexible printed circuit board 1. Consequently, the full flexibility of the multiple LED module 10 is produced. The webs may be provided with suitable supporting elements at the locations at which the resistors 31 are intended to be mounted by means of SMT mounting. These supporting elements form a kind of abutment underneath the flexible printed circuit board 1 for the soldering on of the resistors 31 that is to be effected from above the flexible printed circuit board 1.

Figure 2:
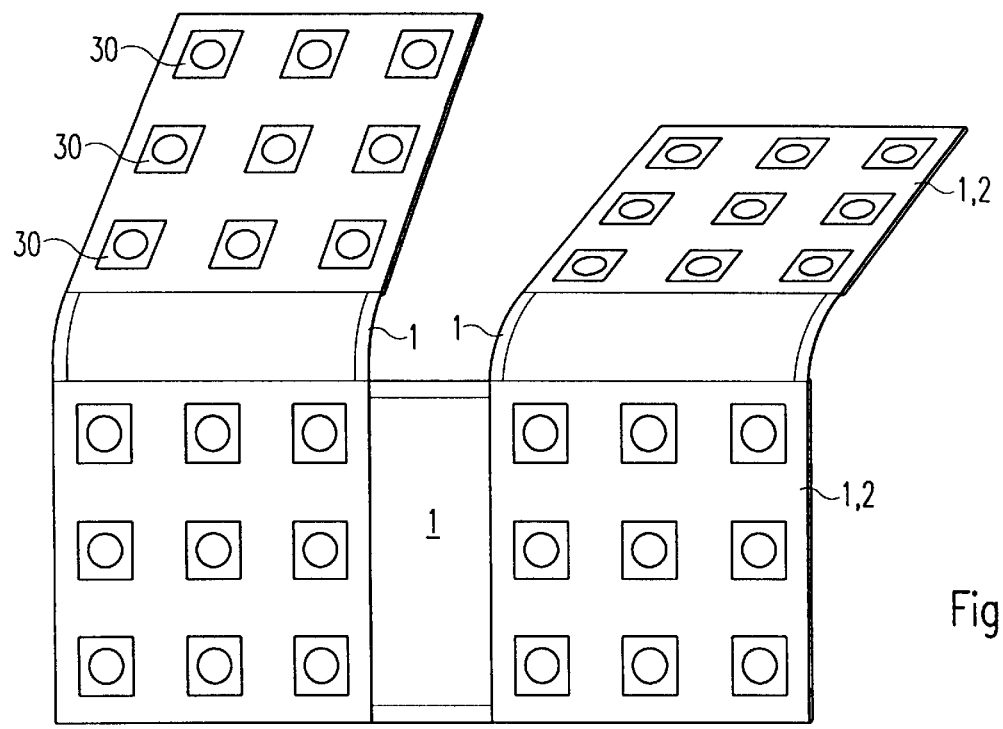
FIG. 2 is a perspective view of an extended form of a multiple LED module according to the invention.

Referring now to FIG. 2, there is illustrated an extended form of a multiple LED module according to the invention. While the basic form of FIG. 1 illustrates an arrangement of a plurality of LED modules in one direction—an arrangement which is to an extent one-dimensional—the embodiment of FIG. 2 shows that the modules can also be arranged along two directions on the flexible printed circuit board 1.

Figures 3A, 3B:
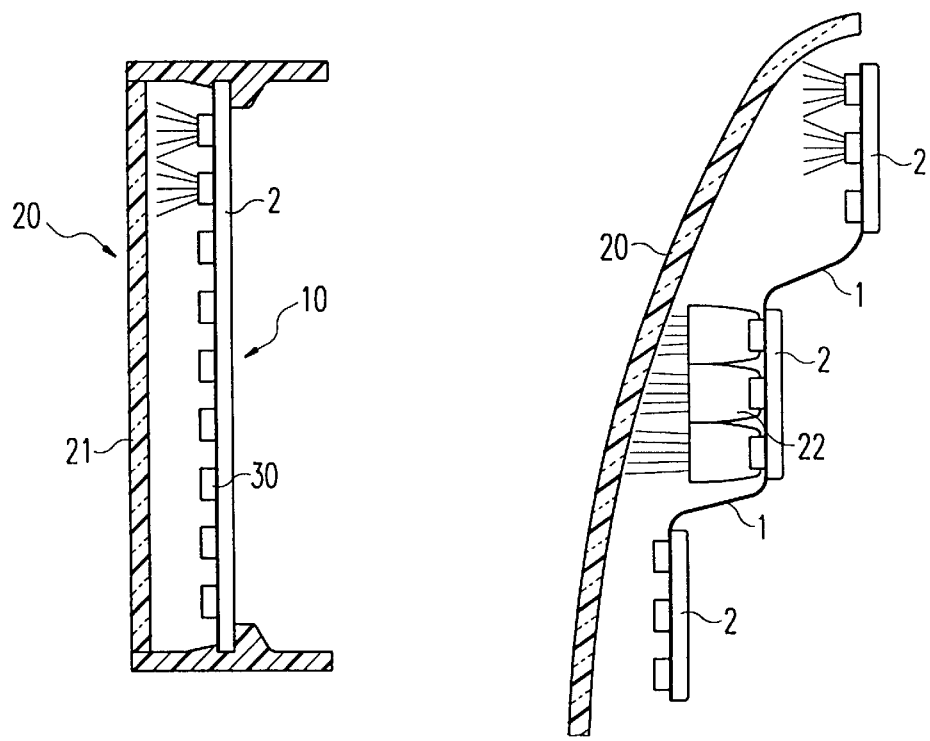
FIGS. 3A and 3B are sectional side and top views, respectively, of a luminaire housing with a multiple LED module inserted therein.

Referring now to FIGS. 3A and 3B, there are illustrated a sectional side view and a sectional plan view, respectively, of a luminaire housing 20 into which the LED module 10 according to the invention is inserted. The housing 20 is preferably composed of plastic and has grooves injection-molded into the plastic on its inner walls, in which grooves the rigid printed circuit boards 2 can snap into place. In this way, the LED module can be fixed reliably in the luminaire housing, with the result that as shown in FIG. 3B all the LEDs 30 of the modules emit in a defined radiation irection.

The transparent front face 21 of the luminaire housing 20 may, if desired, contain a multiplicity of lenses for focussing the light emitted by the LEDs 30. Provision may also be made for additional optical elements 22 for beam guidance and/or focussing to be placed directly in front of the light exit face of the LEDs 30.

In particular, it may be provided that, for example by corresponding configuration of the lateral mounting grooves in the inner wall of the luminaire housing 20, it is possible to change the angular position of the individual modules in the installed state. By changing the angular position, it is possible, in particular, to alter the luminance distribution in order to fulfill specific regulations and legal stipulations.

We claim:

1. A flexible multiple LED module, comprising:
   a flexible printed circuit board;
   a plurality of rigid printed circuit boards having main surfaces connected to said flexible printed circuit board and with a spacing distance between one another; and
   a plurality of LEDs mounted on said flexible circuit board in a region of said rigid printed circuit boards.

2. The flexible multiple LED module according to claim 1, wherein said flexible printed circuit board carries an electric circuit and said LEDs are integrated in said electric circuit applied on said flexible printed circuit board.

3. The flexible multiple LED module according to claim 2, wherein said electric circuit comprises resistors disposed on said flexible printed circuit board in a region of said spacing distance between said rigid printed circuit boards.

4. The flexible multiple LED module according to claim 1, wherein said rigid circuit boards are formed of aluminum.

5. The flexible multiple LED module according to claim 1, wherein said flexible printed circuit board is composed of plastic.

6. The flexible multiple LED module according to claim 1, wherein said flexible printed circuit board is formed of a plastic selected from the group consisting of polyester and polyimide.

7. The flexible multiple LED module according to claim 1, wherein said flexible printed circuit board is constructed from a plurality of layers of polyimide.

8. A multiple LED module assembly, comprising:
   a luminaire housing for a motor vehicle; and
   a flexible multiple LED module mounted in said housing, said flexible multiple LED module including
     a flexible printed circuit board;
     a plurality of rigid printed circuit boards having main surfaces connected to said flexible printed circuit board and with a spacing distance between one another; and
     a plurality of LEDs mounted on said flexible circuit board in a region of said rigid printed circuit boards.

* * * * *